(12) United States Patent
Lee et al.

(10) Patent No.: US 12,189,946 B2
(45) Date of Patent: Jan. 7, 2025

(54) DATA REDUCTION DEVICE, DATA REDUCTION METHOD, AND SYSTEM INCLUDING DATA REDUCTION DEVICE

(71) Applicant: MangoBoost Inc., Bellevue, WA (US)

(72) Inventors: Wonsik Lee, Seoul (KR); Jangwoo Kim, Seoul (KR)

(73) Assignee: MangoBoost, Inc., Bellevue, WA (US)

( * ) Notice: Subject to any disclaimer, the term of this patent is extended or adjusted under 35 U.S.C. 154(b) by 0 days.

(21) Appl. No.: 18/120,114

(22) Filed: Mar. 10, 2023

(65) Prior Publication Data

US 2024/0134521 A1 Apr. 25, 2024
US 2024/0231613 A9 Jul. 11, 2024

(30) Foreign Application Priority Data

Oct. 20, 2022 (KR) .................. 10-2022-0135962
Dec. 30, 2022 (KR) .................. 10-2022-0190624

(51) Int. Cl.
  *G06F 12/00* (2006.01)
  *G06F 3/06* (2006.01)

(52) U.S. Cl.
  CPC .......... *G06F 3/0608* (2013.01); *G06F 3/0644* (2013.01); *G06F 3/0683* (2013.01)

(58) Field of Classification Search
  CPC ..... G06F 3/0608; G06F 3/0644; G06F 3/0683
  See application file for complete search history.

(56) References Cited

U.S. PATENT DOCUMENTS

| 6,185,640 B1* | 2/2001 | Ross ................ G06F 3/0626 710/52 |
| 9,659,060 B2* | 5/2017 | Chambliss .......... G06F 16/215 |
| 11,321,010 B1* | 5/2022 | Jiang .................. G06F 3/0653 |
| 11,409,667 B1* | 8/2022 | Ippatapu ............. G06F 3/0604 |
| 2016/0274792 A1* | 9/2016 | Ogawa ................. G06F 12/10 |
| 2017/0293450 A1* | 10/2017 | Battaje ............... G06F 3/0679 |

(Continued)

FOREIGN PATENT DOCUMENTS

| KR | 20140094468 A | * | 7/2014 |
| KR | 20170054299 A | * | 5/2017 |

(Continued)

OTHER PUBLICATIONS

Mohammadamin Ajdari et al. "CIDR: A Cost-Effective In-Line Data Reduction System for Terabit-Per-Second Scale SSD Arrays", 2019 IEEE International Symposium on HPCA, Mar. 28, 2019.

*Primary Examiner* — Shawn X Gu
*Assistant Examiner* — Mohammad S Hasan
(74) *Attorney, Agent, or Firm* — NKL LAW; Jae Youn Kim

(57) ABSTRACT

A data reduction device, a data reduction method, and a system including the data reduction device are provided. The data reduction device includes a control module configured to generate a control signal in response to a first kernel request received from an external entity, a direct memory access (DMA) engine configured to read request data corresponding to the first kernel request from an external entity in response to the control signal, and a data reduction core configured in such a manner that the request data is reduced through a first operation to be generated first reduction data or the first reduction data is reduced through a second operation to be generated as second reduction data.

18 Claims, 17 Drawing Sheets

(56) References Cited

U.S. PATENT DOCUMENTS

| | | | | |
|---|---|---|---|---|
| 2018/0188974 A1* | 7/2018 | Cayton | ............... | G06F 3/0655 |
| 2018/0335956 A1* | 11/2018 | Iyer | ....................... | G06F 3/067 |
| 2019/0286333 A1* | 9/2019 | Tsuda | .................. | G06F 3/0661 |
| 2021/0019066 A1* | 1/2021 | Li | ....................... | G06F 3/0608 |
| 2022/0405220 A1* | 12/2022 | Zhou | .................... | G06F 3/0613 |
| 2023/0229773 A1* | 7/2023 | Madden, Jr. | .......... | G06F 21/554 |
| | | | | 726/23 |

FOREIGN PATENT DOCUMENTS

| | | | | |
|---|---|---|---|---|
| KR | 10-2019-0041954 A | | 4/2019 | |
| KR | 20200024193 A | * | 3/2020 | |
| WO | WO-2015180649 A1 | * | 12/2015 | ............ G06F 12/02 |

\* cited by examiner

KREQ1 / KREQ2 :

| Opcode | Flags | Size | Source Addr. | Destination Addr. | Context |
|---|---|---|---|---|---|

```
function offload_hash () {
    command cmnd;

cmnd.opcode = HASH; // hash
    cmnd.flags = 1; // this is the last command
    cmnd.size = BLOCK_SIZE; // 4KB
    cmnd.src_addr = 0x1234; // source address
    cmnd.dst_addr = 0xabcd; // destination address
    cmnd.context = NULL; // additional information submit_cmd; // Submit the command to device driver
}
```

FIG. 20

DRSP1 / DRSP2 :

| Opcode | Status | Size | Context |
|--------|--------|------|---------|

FIG. 21

DATA REDUCTION DEVICE, DATA REDUCTION METHOD, AND SYSTEM INCLUDING DATA REDUCTION DEVICE

CROSS-REFERENCE TO RELATED APPLICATION(S)

This application claims benefit of priority to Korean Patent Application Nos. 10-2022-0190624, filed on Dec. 30, 2022 and 10-2022-0135962, filed on Oct. 20, 2022, in the Korean Intellectual Property Office, the disclosures of which are incorporated herein by reference in their entirety.

BACKGROUND

The present disclosure relates to data processing acceleration, and more particularly, to a data reduction device, a data reduction method, and a system including the data reduction device, in which a data reduction operation is performed to accelerate data processing.

Big data or artificial intelligence (AI) has been applied to a wide range of fields, and the use of a large amount of data or streaming data, such as over-the-top (OTT) services, has become commonplace. In this regard, for various interconnectable user devices or systems such as a user terminal, a web server, a web application server (WAS), a storage server, or a data server, a required data throughput is rapidly increasing. On the other hand, resources available in a corresponding terminal or system in preparation for such a request may be limited.

SUMMARY

Example embodiments provide a data reduction device, a data reduction method, and a system including the data reduction method, which may reduce data to be processed in a terminal or system operating with limited resources.

According to an example embodiment, a data reduction device includes a control module configured to generate a control signal in response to a first kernel request received from an external entity, a direct memory access (DMA) engine configured to read request data corresponding to the first kernel request from an external entity in response to the control signal, and a data reduction core configured in such a manner that the request data is reduced through a first operation to be generated first reduction data or the first reduction data is reduced through a second operation to be generated as second reduction data.

The first operation may be a hash operation.

The second operation may be a compression operation.

The control module may control the data reduction core in such a manner that the data reduction core performs the second operation in response to a second kernel request received from an external entity.

The control module may determine whether the first reduction data is a unique value to control the data reduction core in such a manner that the data reduction core performs the second operation.

The data reduction device may further include a traffic scheduler configured to schedule performance of the first operation and the second operation in the data reduction core.

The data reduction core may be provided in plural.

One of the plurality of data reduction cores may perform one of the first operation and the second operation.

The data reduction device may further include a completion controller configured to generate an interrupt signal when any predetermined number of the first kernel requests and the second kernel requests are processed.

The data reduction device may be implemented as a chip or a card.

According to an example embodiment, a system includes a processor configured to generate a first host request, a system memory into which request data corresponding to the first host request is loaded, and a data reduction device configured in such a manner that the request data is reduced through a first operation to be generated as first reduction data or the first reduction data is reduced through a second operation to be generated as second reduction data, in response to a kernel request corresponding to the first host request.

The first operation may be a hash operation, and the second operation may be a compression operation.

The data reduction device may include a control module configured to receive the first kernel request to generate a control signal, a direct memory access (DMA) engine configured to read the request data from the system memory in response to the control signal, and a data reduction core comprising an arithmetic logic corresponding to the first operation or the second operation.

The data reduction device may further include a traffic scheduler configured to schedule performance of the first operation and the second operation in the data reduction core.

The data reduction device may further include a completion controller configured to generate an interrupt signal when any predetermined number of the first kernel request and the second kernel requests are processed.

The data reduction device may generate the second reduction data in response to the second kernel request when the first reduction data is a unique value.

The first kernel request may be hooked by a device mapper of a kernel for the first host request to be replicated to a submission queue of a data reduction device drive of the kernel.

The first kernel request may include a type of the first operation, a size of the request data, and a source address and a destination address for the request data.

According to an example embodiment, a data reduction method includes offloading a hash operation on request data corresponding to a first host request by a data reduction device and offloading a compression operation on a result of the hash operation by the data reduction device when the result of the hash operation is a unique value.

The data reduction method may further include offloading a decompression operation on request data corresponding to a second host request by the data reduction device.

BRIEF DESCRIPTION OF DRAWINGS

The above and other aspects, features, and advantages of the present disclosure will be more clearly understood from the following detailed description, taken in conjunction with the accompanying drawings.

FIG. 20 is a diagram illustrating an example of an offload hash function, called by a device mapper, according to an exemplary embodiment of the present disclosure.

FIG. 21 is a diagram illustrating a format of a first device response or a second device response according to an exemplary embodiment of the present disclosure.

DETAILED DESCRIPTION

Hereinafter, exemplary embodiments of the present disclosure will be described in detail with reference to the drawings. The following detailed description is provided to help comprehensive understanding of a method, an apparatus, and/or a system disclosed herein. However, this is merely exemplary, and the present disclosure is not limited thereto.

While describing the present disclosure, when it is determined that a detailed description of a known art related to the present disclosure may unnecessarily obscure the gist of the present disclosure, the detailed description will be omitted. Terms which will be used below are defined in consideration of functionality in the present disclosure, which may vary according to an intention of a user or an operator or a usual practice. Therefore, definitions thereof should be made on the basis of the overall contents of this specification.

Terminology used herein is for the purpose of describing exemplary embodiments of the present disclosure only and is not intended to be limiting. The singular forms are intended to include the plural forms as well, unless the context clearly indicates otherwise. It should be understood that the terms "comprises," "comprising," "includes," and "including," when used herein, specify the presence of stated features, numerals, steps, operations, elements, or combinations thereof, but do not preclude the presence or addition of one or more other features, numerals, steps, operations, elements, or combinations thereof.

Terms, such as "a first" and "a second", may be used to describe various elements, but the elements should not be restricted by the terms. The terms are used to only distinguish one element from the other element. For example, a first element may be named a second element without departing from the scope of rights of the present disclosure. Likewise, a second element may be named a first element. The term "and/or" includes a combination of a plurality of related and illustrated items or any one of a plurality of related and described items.

Below, exemplary embodiments of the present disclosure will be described in detail and to such an extent that a person of ordinary skill in the art will be able to implement the present disclosure without undue experimentation.

Figure 1:
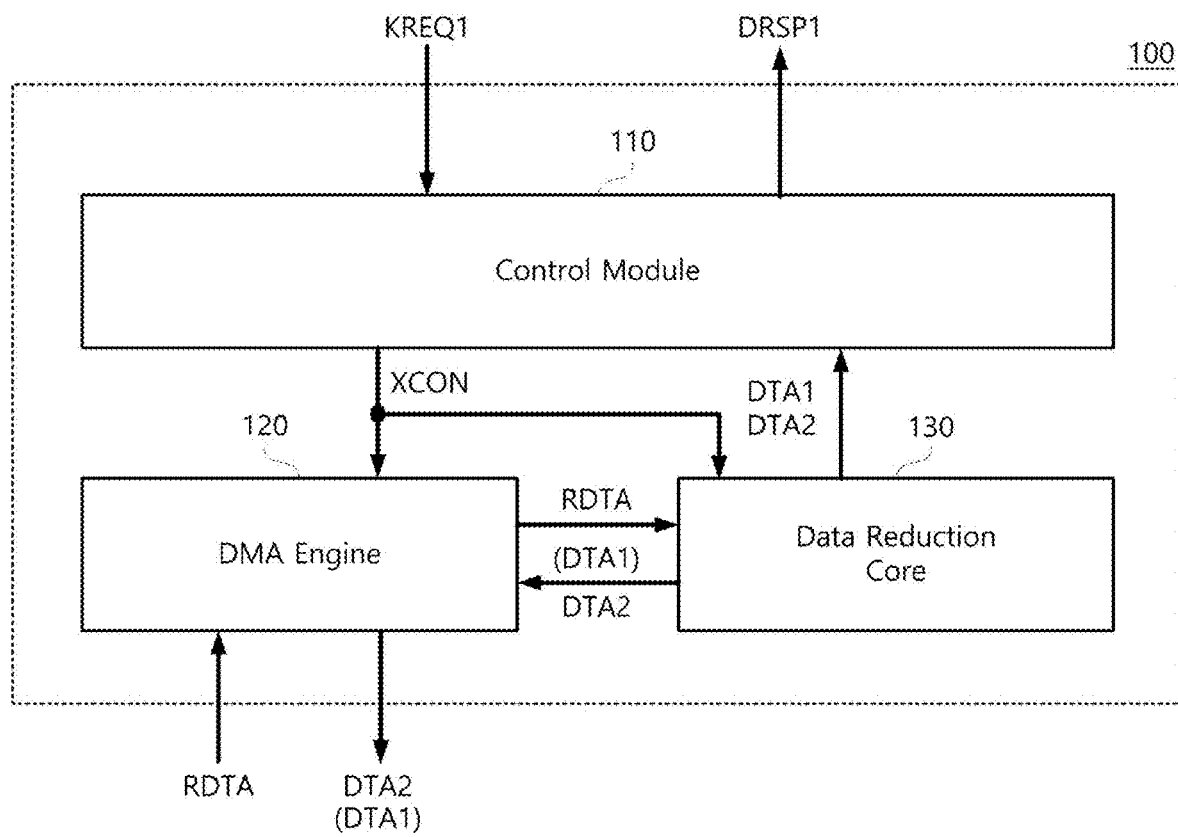
FIG. 1 is a diagram illustrating a data reduction device according to an exemplary embodiment of the present disclosure.
Figure 2:
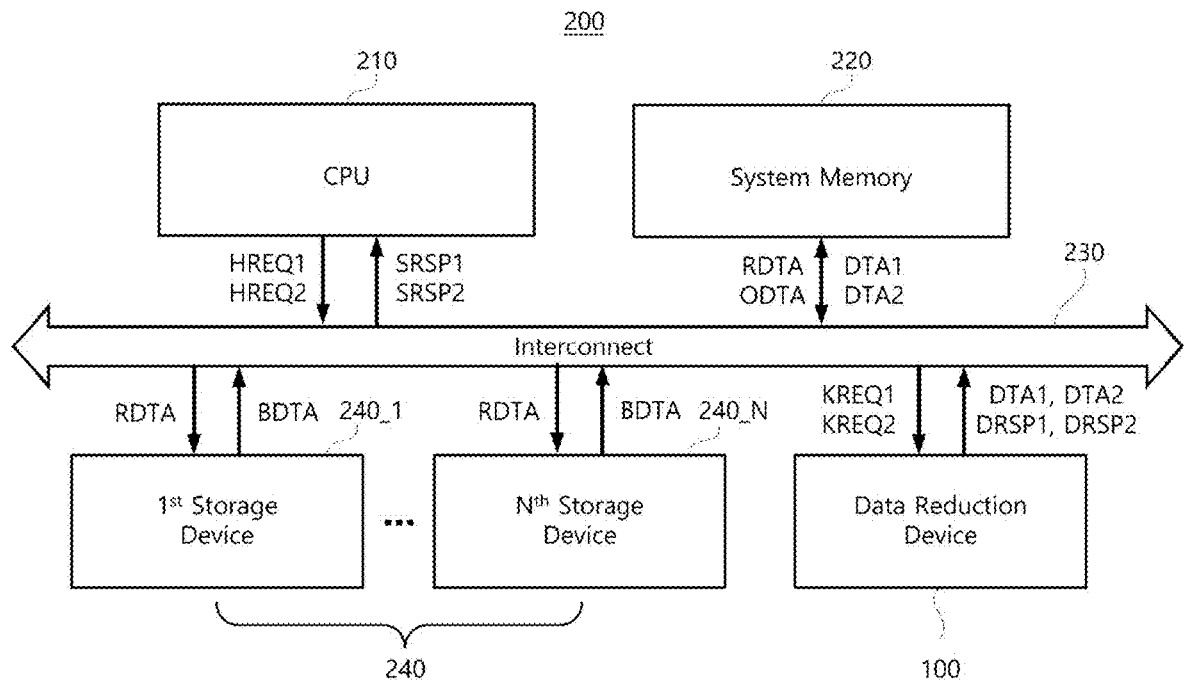
FIG. 2 is a diagram illustrating a system according to an exemplary embodiment of the present disclosure.

FIG. 1 is a diagram illustrating a data reduction device 100 according to an exemplary embodiment, and FIG. 2 is a diagram illustrating a system 200 according to an exemplary embodiment.

Referring to FIGS. 1 and 2, the data reduction device 100 according to an exemplary embodiment may be included in the system 200. The data reduction device 100, implemented as hardware such as a chip or a card, may offload a reduction operation on request data RDTA to improve data processing efficiency in the system 200.

The system 200 according to an exemplary embodiment may include a central processing unit (CPU) 220, generating a first host request HREQ1, and a system memory 220 into which request data RDTA corresponding to the first host request HREQ1 is loaded, in addition to the data reduction device 100. The system 200 according to an exemplary embodiment may be a computing system, a server system, a SmartSSD, a SmartNIC, or the like.

In FIG. 2, the system 200 is illustrated as further including an interconnect 230, interconnecting the CPU 210, the system memory 220, and the data reduction device 100, and a plurality of storage devices 240 connected to the interconnect 230. However, exemplary embodiments are not limited thereto. A configuration and a method of connecting components to the data reduction device 100 in the system 200 may be different from those of FIG. 2. In addition, the system 200 according to an exemplary embodiment may further include an additional component virtualizing the stored device 240, connected to the data reduction device 100, to obtain a data reduction effect while allowing a user in a virtual environment to use the same device driver (for example, a nonvolatile memory (NVMe) device driver) as in an existing environment.

The data reduction device 100 according to an exemplary embodiment may include a control module 110, a direct memory access (DMA) engine 120, and a data reduction core 130.

The control module 110 may generate a control signal XCON in response to a first kernel request KREQ1 received from an external entity. The first kernel request KREQ1 may be received from a kernel of the system 200 to which the data reduction device 100 according to an exemplary embodiment is connected. For example, the first kernel request KREQ1 may be received from a kernel, interfacing the CPU 210 and the data reduction device 100 each other, as a portion of an operating system resident in the system memory 220 of the system 200. A more detailed description of a format and a generating operation of the first kernel request KREQ1 will be described later.

The DMA engine 120 may read a request data RDTA, corresponding to the first kernel request KREQ1, from an external entity in response to the control signal XCON. The request data RDTA may be data written in the system memory 220 in response to the first host request HREQ1 of the CPU 210. For example, the request data RDTA may be data written in the storage device 240 in response to a write request of the CPU 210. For example, the request data RDTA may be data loaded into the system memory 220 to be written in the storage device 240 based on a write request of the CPU 210.

The control signal XCON may include information on a position and a size of the request data RDTA in the system memory 220. The request data RDTA may be defined in units of blocks set to one of various sizes. The DMA engine 120 of the data reduction device 100 may access the system memory 220 independently of the CPU 210 to read the requested data RDTA of a corresponding positon in a corresponding size.

The data reduction core 130 may generate first reduction data DTA1 or second reduction data DTA2. The first reduction data DTA1 may be generated by reducing the request data RDTA through a first operation. The second reduction data DTA2 may be generated by reducing the first reduction data DTA1 through a second operation.

The first operation may be a hash operation to convert request data RDTA having any size into request data having a fixed size. For example, in the hash operation according to an exemplary embodiment, the first operation may be a secure hash algorithm (SHA) such as SHA1, SHA2, SHA3, SHA256, or SHA512, or may be one or more algorithms, among various hash algorithms such as a message-digest 5 (MD5) hash algorithm, or the like.

The second operation may be a compression operation. For example, the compression operation according to an exemplary embodiment may be one or more algorithms, among various compression algorithms such as gunzip (gzip), snappy, lz4, zstd, or zlib.

The data reduction core 130 may vary whether to perform the second operation, depending on the first reduction data DTA1 which a result of the first operation.

Figure 3:
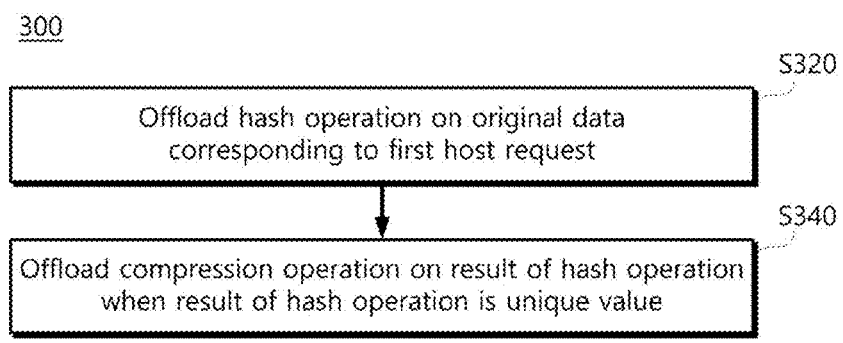
FIG. 3 is a diagram illustrating a data reduction method according to an exemplary embodiment of the present disclosure.

FIG. 3 is a diagram illustrating a data reduction method 300 according to an exemplary embodiment.

Referring to FIGS. 1 to 3, the data reduction method 300 according to an exemplary embodiment may include offloading a hash operation (S320) and offloading a compression operation (S340). The offloading the hash operation (S320) and the offloading the compression operation (S340) may be performed by the data reduction device 100.

As described above, the data reduction core 130 may perform a hash operation on the request data RDTA corresponding to the first host request HREQ1 to generate first reduction data DTA1, or may subject the first reduction data DTA1 to a compression operation to be generated as second reduction data DTA2. The first host request HREQ1 may be a write request of the request data RDTA for the storage device 240 of the CPU 210. In this case, the data reduction core 130 may perform a compression operation only when the first reduction data DTA1 is a unique value.

The phrase "the first reduction data DTA1 is a unique value" may mean that the same value is not written in the system memory 220. For example, when the first operation is a hash operation, the phrase "the first reduction data DTA1 is a unique value" may mean that data, obtained by performing the second operation on data having the same hash value or the same hash value, is not written in the system memory 220.

Figure 4:
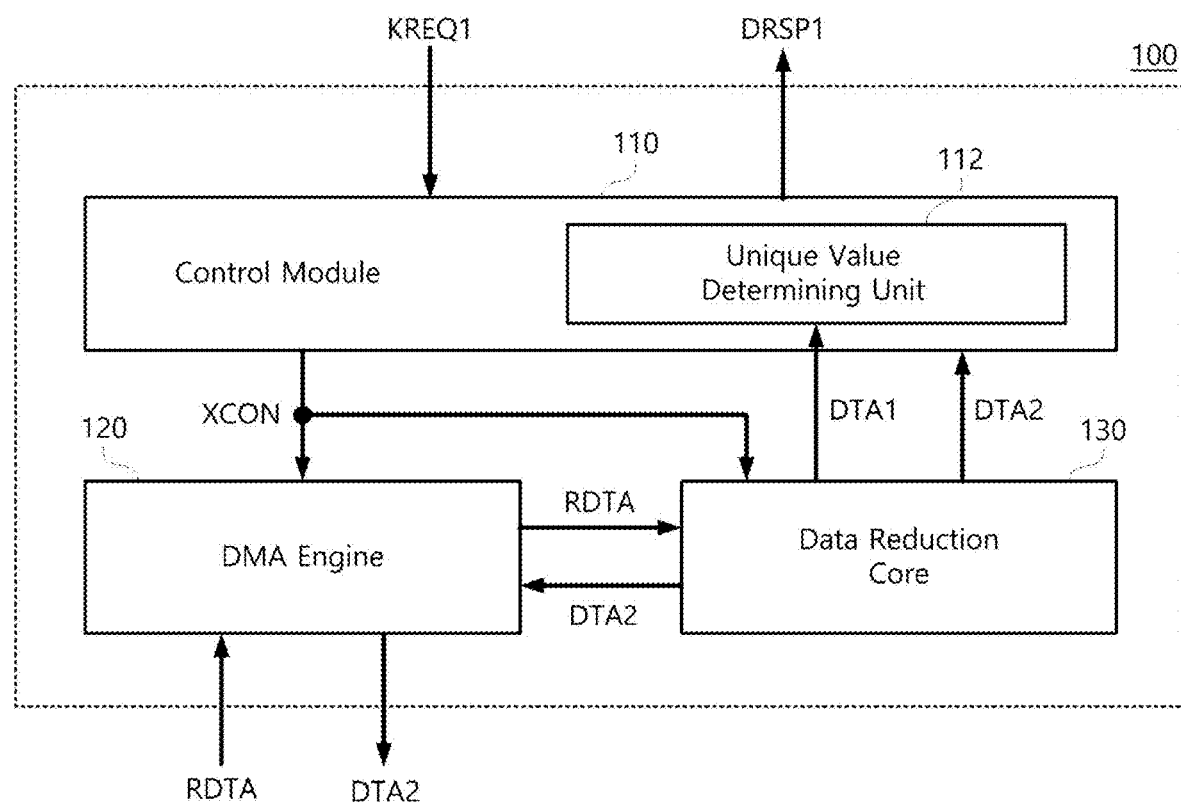
FIG. 4 is a diagram illustrating a data reduction device, including a unique value determining unit, according to an exemplary embodiment of the present disclosure.

FIG. 4 is a diagram illustrating a data reduction device 100, including a unique value determining unit 112, according to an exemplary embodiment.

Referring to FIGS. 2 and 4, a control module 110 of the data reduction device 100 according to an exemplary embodiment may include a unique value determining unit 112. The unique value determining unit 112 may determine whether the first reduction data DTA1 is a unique value. When the first reduction data DTA1 is received from the data reduction core 130, the unique value determining unit 112 may check whether the same value as the first reduction data DTA is present in a first mapping table, not illustrated, and may perform a determination operation based on a result of the checking.

The control module 110 may transmit the control signal XCON to the data reduction core 130 based on a result of the determination of the unique value determining unit 112. The data reduction core 130 may generate second reduction data DTA2 in response to the control signal XCON indicating that the first reduction data DTA1 is a unique value.

When the first reduction data DTA1 is not the unique value, the control module 110 may output a first device response DRSP1 indicating that an operation on the first kernel request KREQ1 has been completed due to generation of the first reduction data DTA1. In this case, the request data RDTA may be processed as duplicate data. For example, the system 200 may not perform an additional write operation of writing the duplicate data in the system memory 220, and may set information on a position of the request data RDTA in the system memory 220 to a position in which the duplicate data is stored. The information on the position of the request data RDTA may be stored in the system memory 220 in the form of a mapping table, or the like.

Meanwhile, when the first reduction data DTA1 is a unique value, the control module 110 may output a first device response DRSP1 indicating that an operation on the first kernel request KREQ1 has been completed due to generation of the second reduction data DTA2. The second reduction data DTA2 may be output to an external entity through the DMA engine 120. For example, the DMA engine 120 may write the second reduction data DTA2 in the system memory 220 of FIG. 2.

Figure 5:
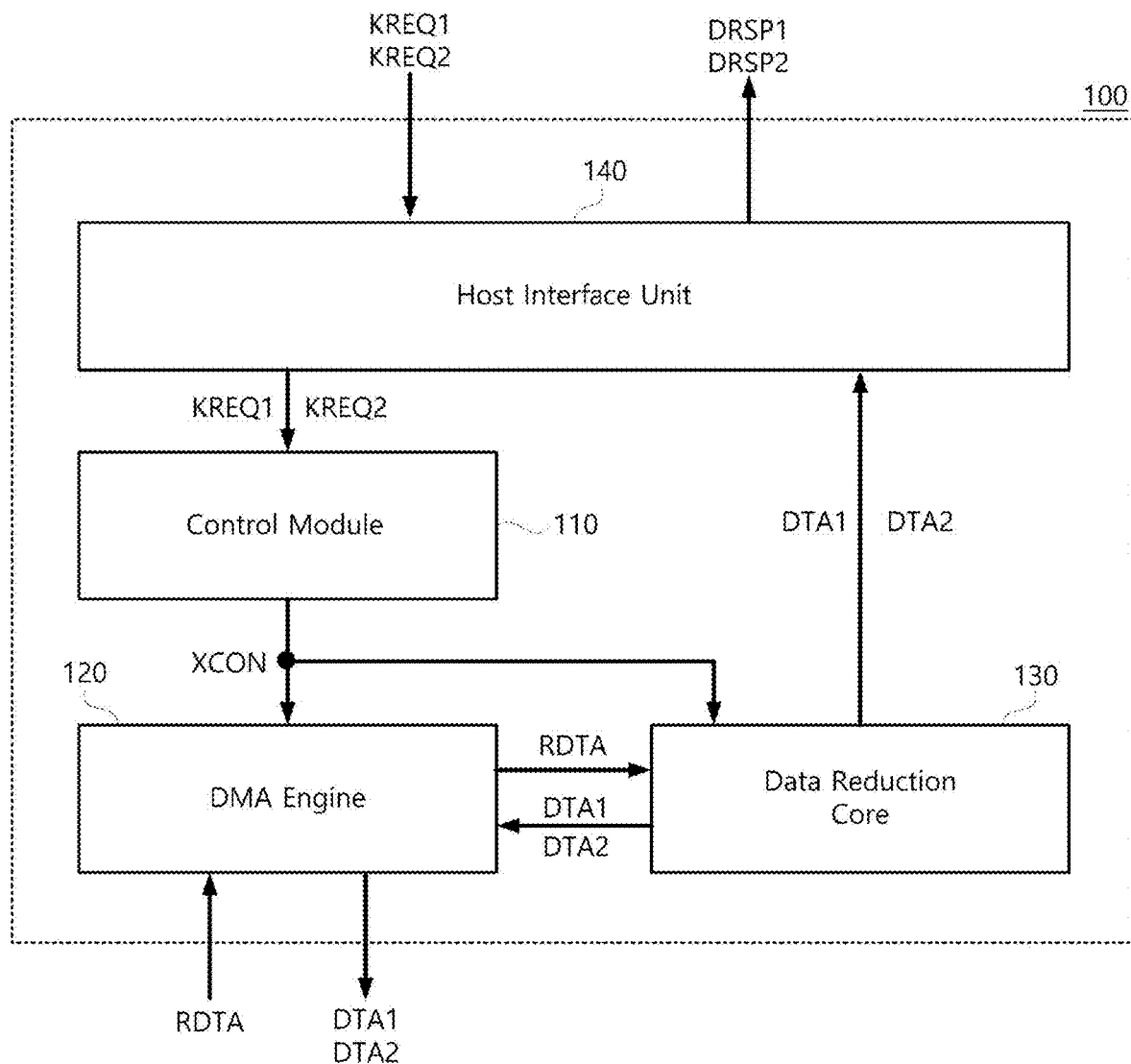
FIG. 5 is a diagram illustrating a data reduction device, including a host interface unit, according to an exemplary embodiment of the present disclosure.

FIG. 5 is a diagram illustrating a data reduction device 100, including a host interface unit 140, according to an exemplary embodiment.

Referring to FIG. 5, the data reduction device 100 may include a control module 110, a DMA engine 120, and a data reduction core 130, similarly to that of FIG. 1, or the like. The data reduction device 100 of FIG. 5 may further include a host interface unit 140. As an example, the host interface unit 140 may be implemented to be included in the control module 110.

The host interface unit 140 may receive a first kernel request KREQ1 from an external entity and then transmit the received kernel request KREQ1 to the control module 110, and may output an operation result of the data reduction core 130 as a first device response DRSP1 to the first kernel request KREQ1. For example, the host interface unit 140 may output a first device response DRSP1 indicating that generation of first reduction data DTA1 has been completed.

Also, the host interface unit 140 may receive a second kernel request KREQ2 from an external entity and then transmit the received second kernel request KREQ2 to the control module 110. The second kernel request KREQ2 may be a request received after the first device response DRSP1 is output when the first reduction data DTA1 is a unique value.

The control module 110 may transmit a control signal XCON to the data reduction core 130 in response to the second kernel request KREQ2. The data reduction core 130 may generate second reduction data DTA2 in response to the control signal XCON indicating the first reduction data DTA1 is a unique value.

The control module 110 may generate a second device response DRSP2, indicating an operation on the second kernel request KREQ2 has been completed due to generation of the second reduction data DTA2, in response to the second kernel request KREQ2 indicating the first reduction data DTA1 is a unique value. In addition, the control module 110 may control the first reduction data DTA1 or the second reduction data DTA2 such that the first reduction data DTA1 or the second reduction data DTA2 is output to an external entity through the DMA engine 120. The DMA engine may write the first reduction data DTA1 or the second reduction data DTA2 into the system memory 220 of FIG. 2.

The host interface unit 140 of FIG. 5 may be provided in the data reduction device 100 of FIG. 1 or 4. For example, the host interface unit 140 included in the data reduction device 100 of FIG. 4 may transmit the first kernel request KREQ to the control module 110 and may output information on generation of the first reduction data DTA1 or information on generation of the second reduction data DTA2 in the form of a first device response DRSP1 or a second device response DRSP2 to the first kernel request KREQ1.

Hereinafter, a description will be provided under the assumption of the example of FIG. 5 unless otherwise stated.

Figure 6:
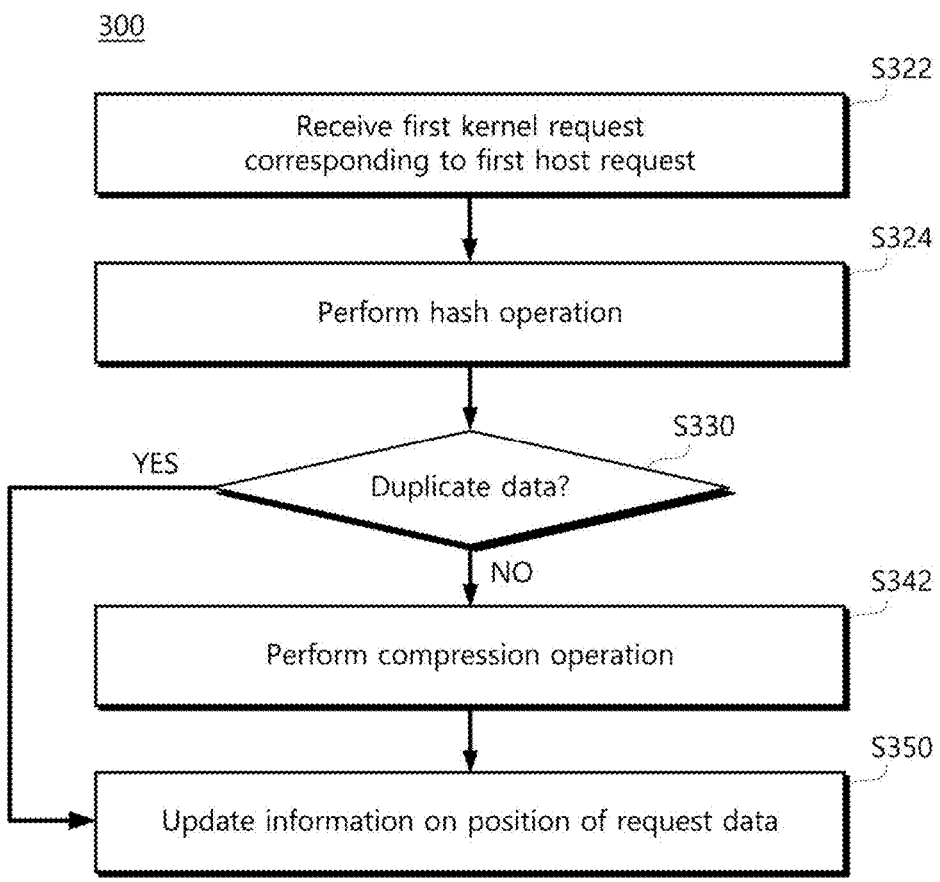
FIG. 6 is a diagram illustrating a data reduction method for a write request according to an exemplary embodiment of the present disclosure.

FIG. 6 is a diagram illustrating a data reduction method 300 for a write request according to an exemplary embodiment.

Referring to FIGS. 2, 5, and 6, a data reduction method 300 according to an exemplary embodiment may include receiving the first kernel request KREQ1 corresponding to the first host request, a write request, by the host interface unit 140 (S322). In this case, the data reduction core 130 may perform a hash operation on the request data RDTA in response to the first kernel request KREQ1 (S324). A result of the hash operation may be generated as the first reduction data DTA1.

A check may be made as to whether the request data RDTA is duplicate data, based on the result of the hash operation (S330). For example, a determination may be made as to whether the request data RDTA is duplicate data, based on whether the result of the hash operation is a unique value. As described above, by the unique value determining unit 112 or the second kernel request KREQ2, a check may be made as to whether the first reduction data DTA1 is a unique value.

When it is determined that the request data RDTA is not duplicate data ("NO" of S330), for example, when the first reduction data DTA1 for the request data RDTA is a unique value, a compression operation may be performed by the data reduction core 130 (S342). A compression operation may be performed on the first reduction data DTA1 to generate second reduction data DTA2. The second device response DRSP2, indicating that the compression operation has been completed, may be output as a response to the second kernel request KREQ2 and information on a position of the request data RDTA in the system memory 220 may be updated to a position in which the second reduction data DTA2 is written (S350). An operation of updating the information on the position of the request data RDTA in the system memory 220 may be performed through a kernel of the system 200.

When it is determined that the request data RDTA is duplicate data ("YES" of S330), for example, when the first reduction data DTA1 for the request data RDTA is not a unique value, the information on the position of the request data RDTA in the system memory 220 may be updated to a position in which the second reduction data DTA2 is written (S350).

A description has been described of the case in which the first kernel request KREQ1 or the first host request HREQ1 is a write request for the storage device 240 of the CPU 210. Next, a description will be provided of an operation in which the first kernel request KREQ1 is processed in the data reduction device 100 according to an exemplary embodiment when the second host request HREQ1 is a read request for the storage device 240 of the CPU 210. In this case, the request data RDTA may be data read from the storage device 240 to correspond to a read request of the CPU 210. For example, the request data RDTA corresponding to the read request of the CPU 210 may be data stored in the form of the second reduction data DTA2 and then loaded into the system memory 220.

Figure 7:
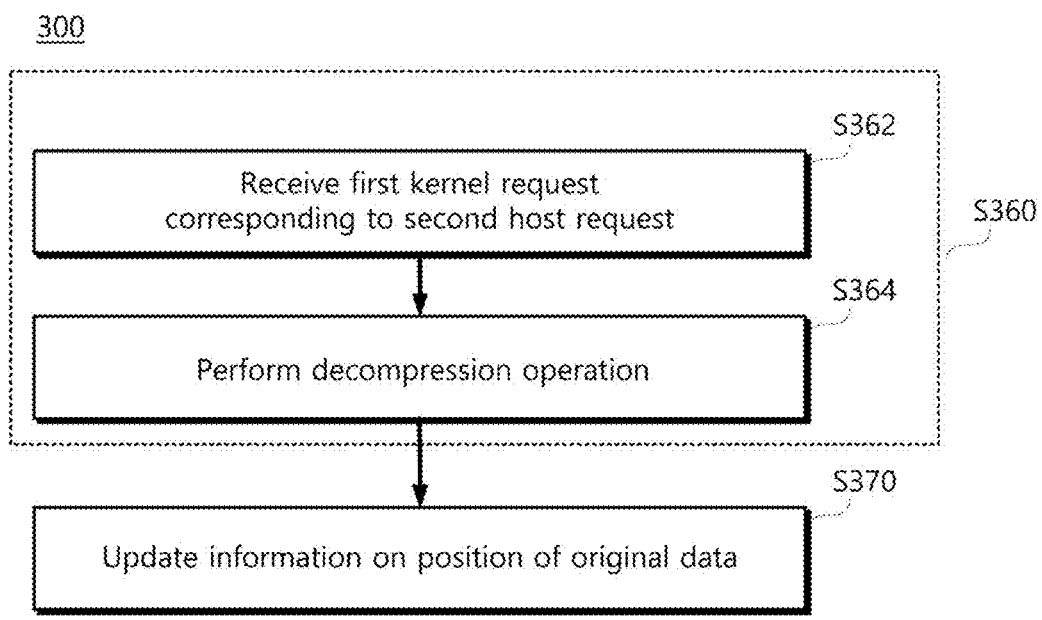
FIG. 7 is a diagram illustrating a data reduction method for a read request according to an exemplary embodiment of the present disclosure.
Figure 8:
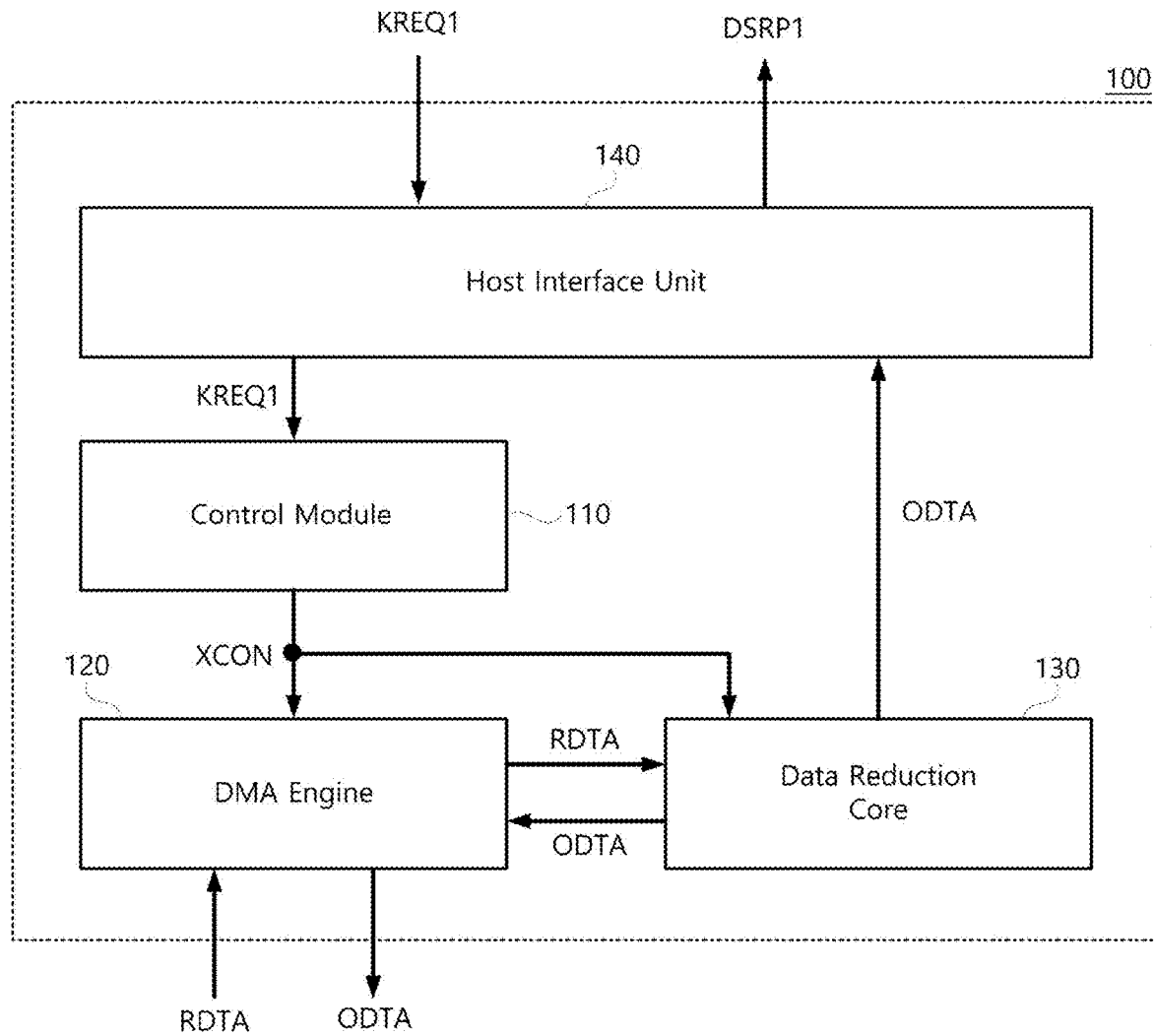
FIG. 8 is a diagram illustrating a data reduction device, operating based on the data reduction method of FIG. 7, according to an exemplary embodiment of the present disclosure.

FIG. 7 is a diagram illustrating a data reduction method 300 for a read request according to an exemplary embodiment, and FIG. 8 is a diagram illustrating a data reduction device 100, operating based on the data reduction method 300 of FIG. 7, according to an exemplary embodiment.

Referring to FIGS. 2, 7, and 8, the data reduction method 300 according to an exemplary embodiment may include offloading a decompression operation by the data reduction device 100 (S360). The offloading the decompression operation (S360) may be performed when the second host request HREQ2 is a request for reading request data RDTA from the storage device 240.

The host interface unit 140 may receive a first kernel request KREQ1 corresponding to a second host request HREQ2 (S362). The second host request HREQ2 may be a read request for the storage device 240, and the first kernel request KREQ1 may be a request for the decompression operation. The control module 110 may generate a control signal XCON in response to the first kernel request KREQ1 received by the host interface unit 140. For the first kernel request KREQ1, the DMA engine 120 may read request data RDTA from the system memory 220 in response to the control signal XCON.

The request data RDTA may be loaded into the system memory 220 in a form corresponding to the second reduction data RDTA. For example, the request data RDTA may be also loaded into the system memory 220 in units of blocks when the request data RDTA is written in the storage device 240 as block data BDTA in which any number of pieces of second reduction data DTA2 are packed into a single block.

The data reduction core 130 may perform a decompression operation on the request data RDTA in response to the first kernel request KREQ1 (S364). The data reduction core 130 may generate the request data RDTA as original data ODTA through the decompression operation. The original data ODTA may be written in the system memory 220 through the DMA engine 120. A first device response DRSP1, indicating that the decompression operation has been completed, may be output as a response to the first kernel request KREQ1 and information on a position of the request data RDTA in the system memory 220 may be updated to a position in which the original data ODTA is written (S370).

Figure 9:
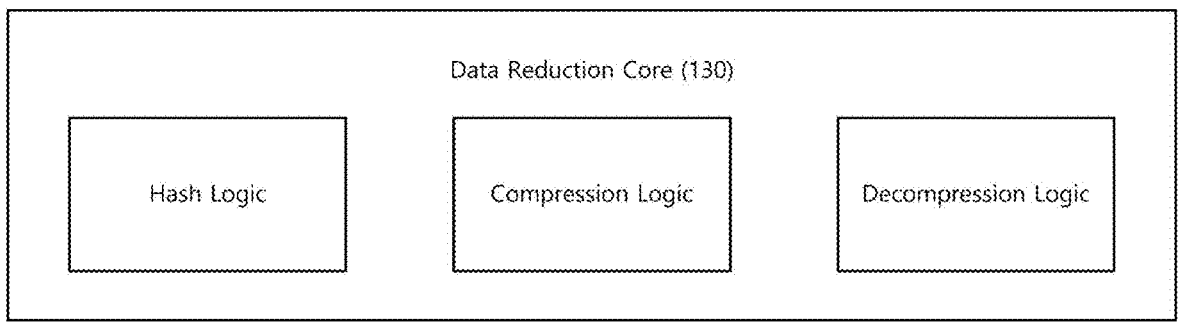
FIG. 9 is a diagram illustrating a data reduction core according to an exemplary embodiment of the present disclosure.

FIG. 9 is a diagram illustrating a data reduction core 130 according to an exemplary embodiment.

Referring to FIG. 9, the data reduction core 130 according to an exemplary embodiment may include a hash logic performing a hash operation, a compression logic performing a compression operation, and a decompression logic performing a decompression operation. The hash logic, the compression logic, and the decompression logic may include various logic circuit devices such as an inverter, a buffer, a flop-flop, or the like. The hash logic, the compression logic, and the decompression logic may share at least some of the logic circuit devices when performing an arithmetic operation. Furthermore, the hash logic, the compression logic, and the decompression logic may also share a first-in-first-out (FIFO) or a digital signal processor (DSP).

Figure 10:
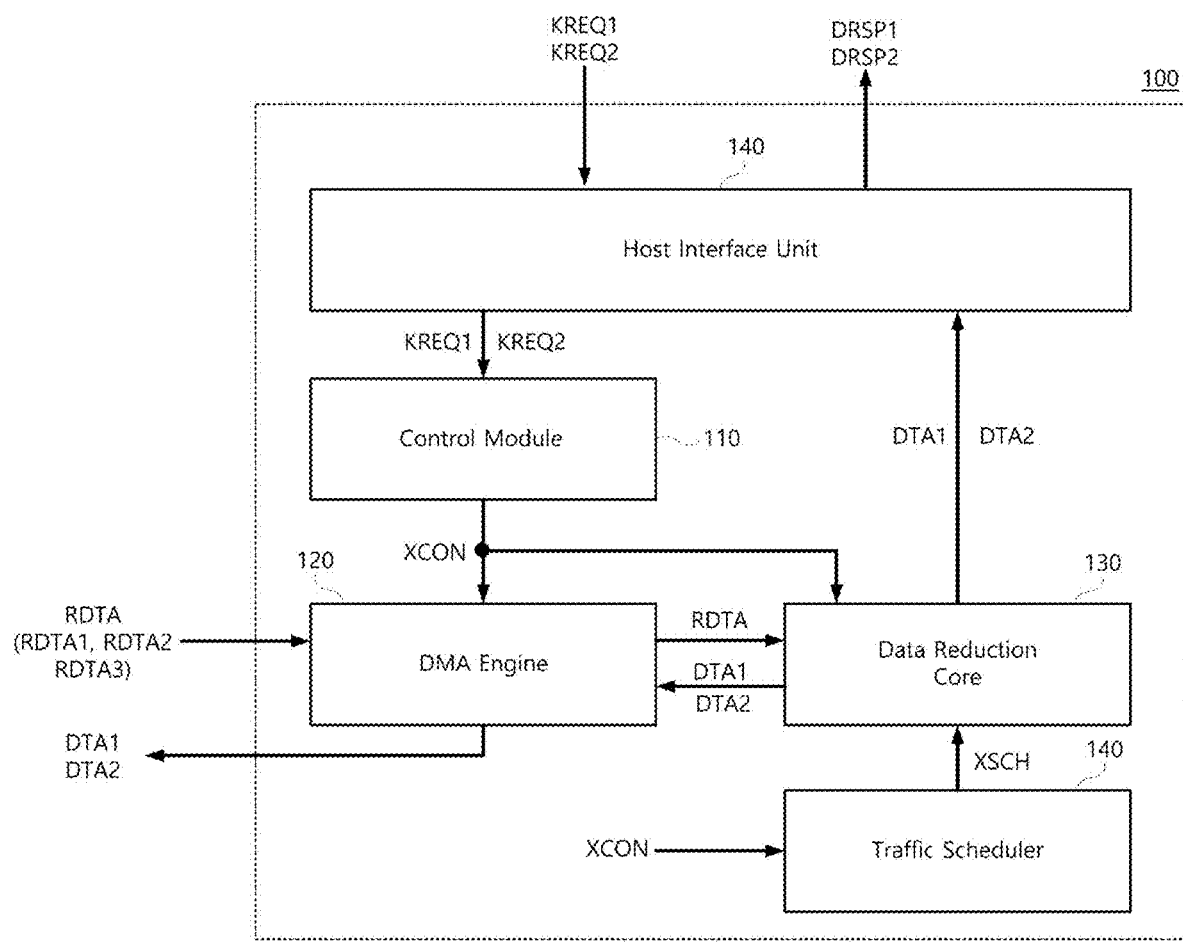
FIG. 10 is a diagram illustrating a data reduction device, including a traffic scheduler, according to an exemplary embodiment of the present disclosure.
Figure 11:
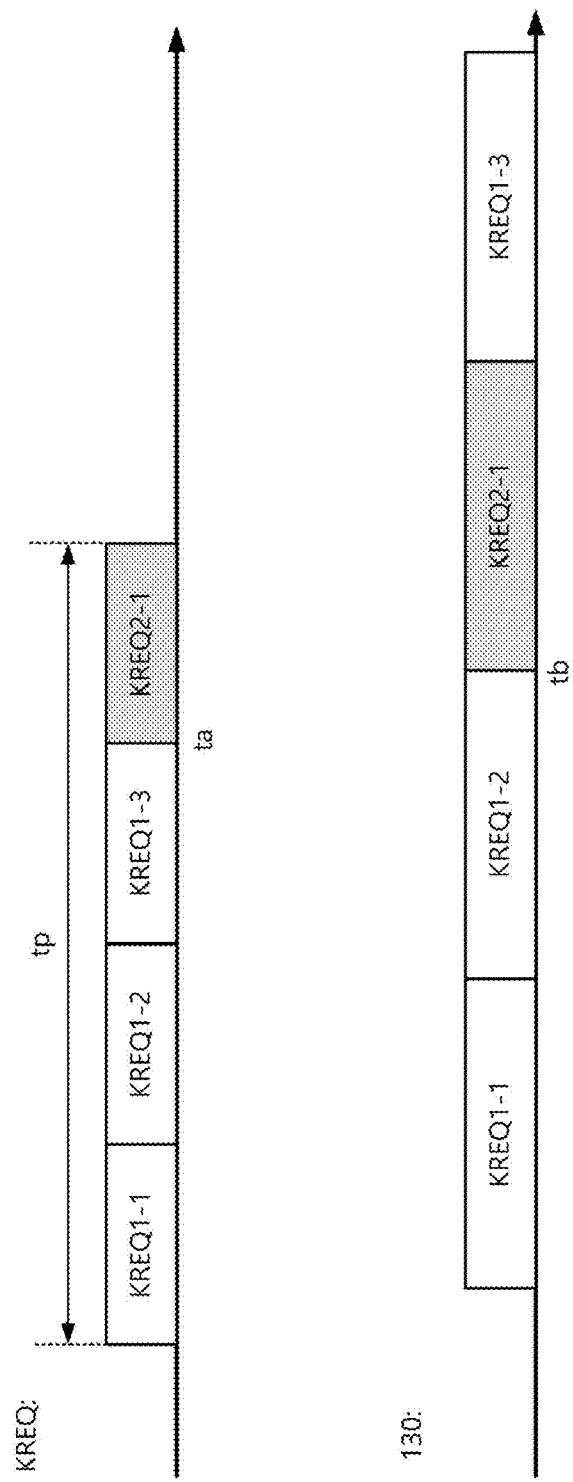
FIGS. 11 and 12 are diagrams, each illustrating an operation of a traffic scheduler according to an exemplary embodiment of the present disclosure.
Figure 12:
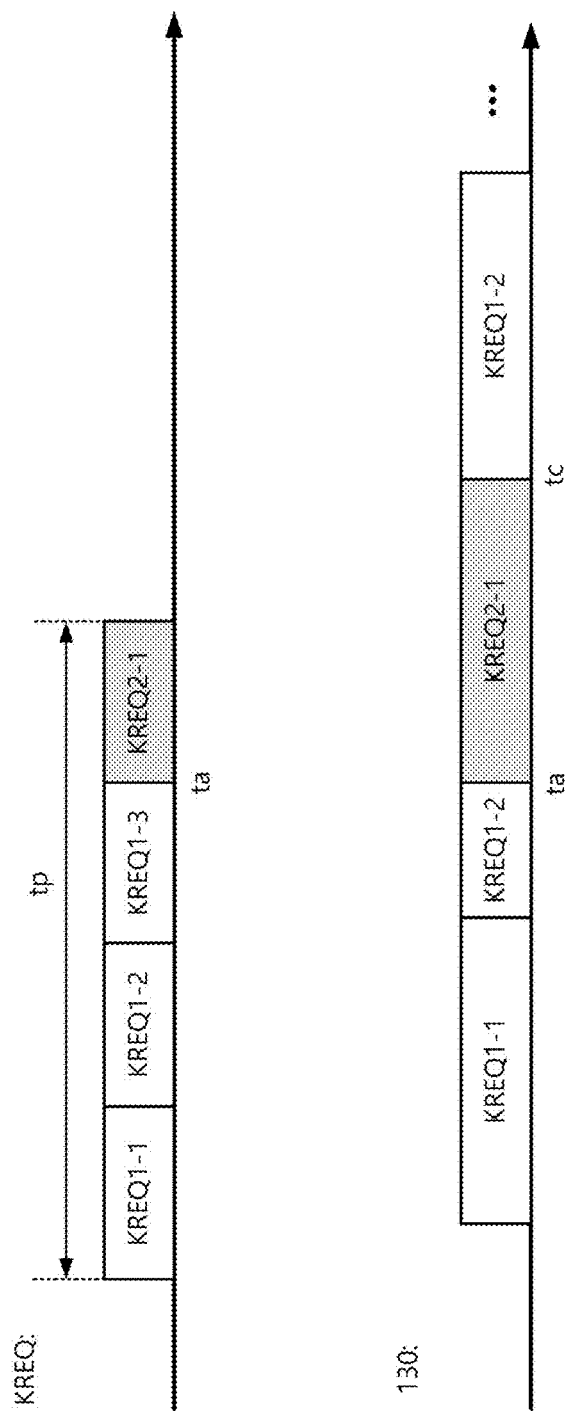

FIG. 10 is a diagram illustrating a data reduction device 100, including a traffic scheduler 150, according to an exemplary embodiment, and FIGS. 11 and 12 are diagrams, each illustrating an operation of the traffic scheduler 150 according to an exemplary embodiment.

Referring to FIGS. 10 and 11, the data reduction device 100 according to an exemplary embodiment may include a control module 110, a DMA engine 120, a data reduction core 130, and a host interface unit 140, similarly to that of FIG. 5. The data reduction device 100 of FIG. 10 may further include a traffic scheduler 150.

The traffic scheduler 150 may schedule performance of a first operation and a second operation in the data reduction core 130 and transmit the scheduled performance to the data reduction core 130 as a schedule signal XSCH. For example, when the performance of the first operation requires more time or is more frequent than the performance of the second operation, the traffic scheduler 150 may adjust an order in which the first operation and the second operation are performed. The data reduction core 130 may perform a corresponding operation in response to the schedule signal XSCH. As described above, the data reduction core 130 may selectively perform the second operation on each request data RDTA based on a result of the first operation. Accordingly, the number of first operations to be performed by the data reduction core 130 may be different from the number of second operations to be performed by the data reduction core 130. In this case, before the first operation is performed on the same request data RDTA and the second operation is then performed thereon, the data reduction core 130 may be requested to perform the first operation on another request data RDTA. For example, the data reduction core 130 may be requested to perform the first operation on another request data RDTA between the first operation and the second operation on one request data RDTA.

In the example of FIG. 11, the kernel request KREQ for the first operation is received by the data reduction device 100 three times in a certain period tp, while the kernel request KREQ for the second operation is received by the data reduction device 100 only once in the certain period tp. A 1-1-th kernel requests KREQ1-1 to a 1-3-th kernel requests KREQ1-3 may indicate a request for the first operation on difference pieces of request data RDTA, for example, first request data RDTA1 to third request data RDTA3, respectively. A request of the second operation for the first request data RDTA1 corresponding to the 1-1-th kernel request KREQ1-1 may be received by the data reduction device 100 as a 2-1-th kernel request KREQ2-1.

In FIG. 11, the 1-1-th kernel request KREQ1-1 to the 1-3-th kernel request KREQ1-3 and the 2-1-th kernel request KREQ2-1 are illustrated as being sequentially generated. In this case, the 1-1-th kernel request KREQ1-1 to the 1-3-th kernel request KREQ1-3 and the 2-1-th kernel request KREQ2-1 may be received by the data reduction device 100 in the order of generation thereof. Alternatively, the 1-1-th kernel request KREQ1-1 to the 1-3-th kernel request KREQ1-3 and the 2-1-th kernel request KREQ2-1 may be simultaneously received by the data reduction device 100, regardless of the order of generation thereof. However, the description of FIGS. 11 and 12 will be provided under the assumption that the 1-1-th kernel request KREQ1-1 to the 1-3-th kernel request KREQ1-3 and the 2-1-th kernel request KREQ2-1 are sequentially received by the data reduction device 100.

It is assumed that the data reduction core 130 performs an arithmetic operation in the order in which kernel requests KREQ are received by the data reduction device 100. The data reduction core 130 may perform an operation on the 2-1-th request KREQ2-1 for the first request data RDTA1 only after completing an operation on the 1-2-th kernel request KREQ1-2 and the 1-3-th kernel requests KREQ1-3. Accordingly, processing of the first request data RDTA1 may be delayed, and another operation affected by a result of the processing of the first request data RDTA1 may also be delayed.

The traffic scheduler 150 according to an exemplary embodiment adjust the order of the received kernel requests KREQ to prevent the above issue from occurring. FIG. 11 illustrates an example in which when the 2-1-th kernel request KREQ2-1 is received at a traffic point in time ta, in spite of presence of a previously received kernel request (for example, a 1-3-th kernel request KREQ1-3), the scheduler 150 may adjust a processing order of the received requests to be different. According to the scheduling of the traffic scheduler 150, when a first operation corresponding to the 1-2-th kernel request KREQ1-2 which is being processed at the point in time $t_a$, at which the 2-1-th kernel request KREQ2-1 is received, is completed (at a point int time $t_b$), the data reduction core 130 may start to perform a second operation corresponding to the 2-1-th kernel request KREQ2-1, rather than the 1-3-th kernel request KREQ1-3.

Referring to FIGS. 10 and 12, the traffic scheduler 150 according to an exemplary embodiment may perform scheduling on a kernel request KREQ to be different even when the kernel request KREQ is received by the data reduction device 100 in the same manner as in FIG. 11. For example, when the 2-1-th kernel request KREQ2-1 is received at a point in time $t_a$, the traffic scheduler 150 may perform scheduling to complete a first operation corresponding to the 1-2-th kernel request KREQ1-2 which is being processed by the data reduction core 130 and to immediately perform a second operation corresponding to the 1-2-th kernel request KREQ1-2. In this case, the traffic scheduler 150 may perform scheduling to restart the first operation corresponding to the 1-2 kernel request KREQ1-2, of which processing was stopped at the point in time $t_a$, at a point in time $t_c$ at which the performance of the second operation corresponding to the 2-1-th kernel request KREQ2-1 has been completed.

Figure 13:
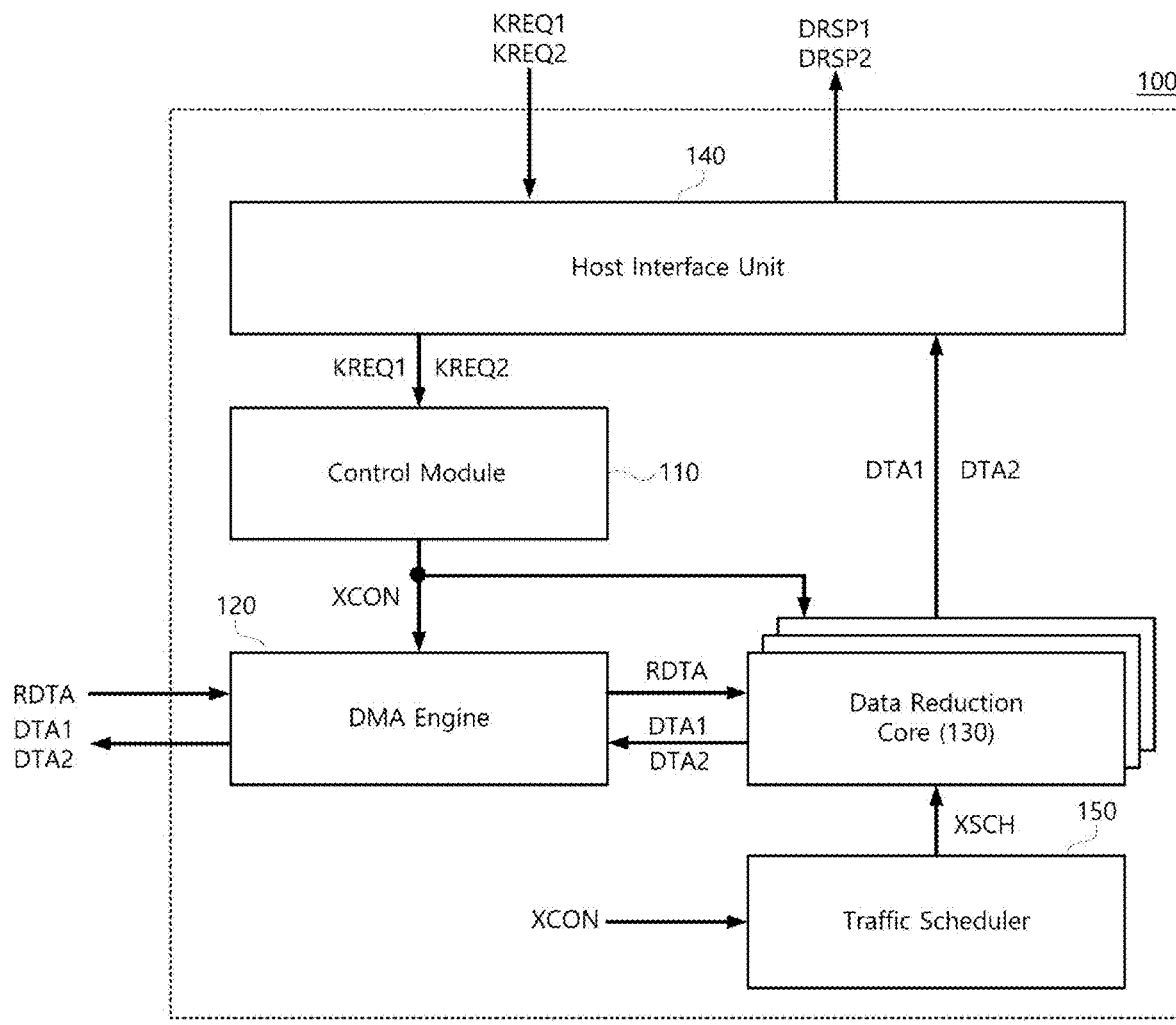
FIG. 13 is a diagram illustrating a data reduction device, including a plurality of data reduction cores, according to an exemplary embodiment of the present disclosure.
Figure 14:
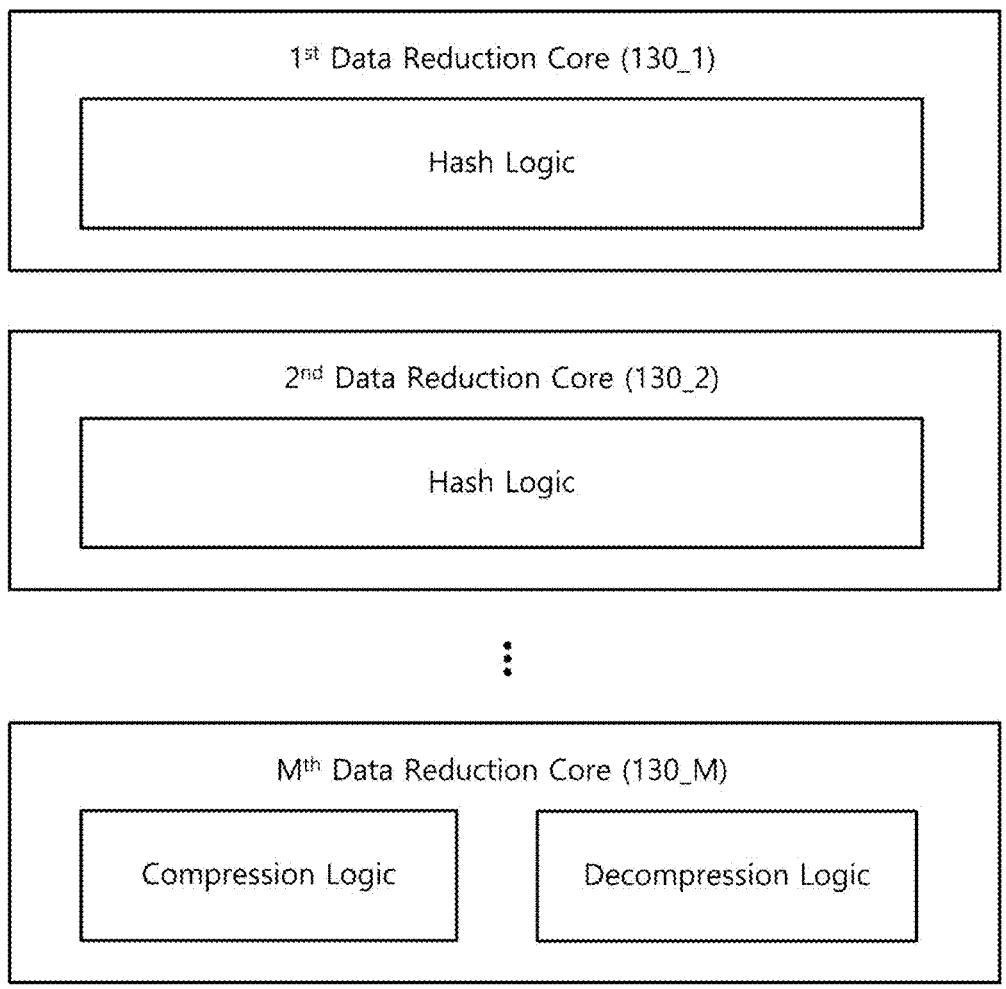
FIGS. 14 to 16 are diagrams, each illustrating a plurality of data reduction cores according to an exemplary embodiment of the present disclosure.
Figure 15:
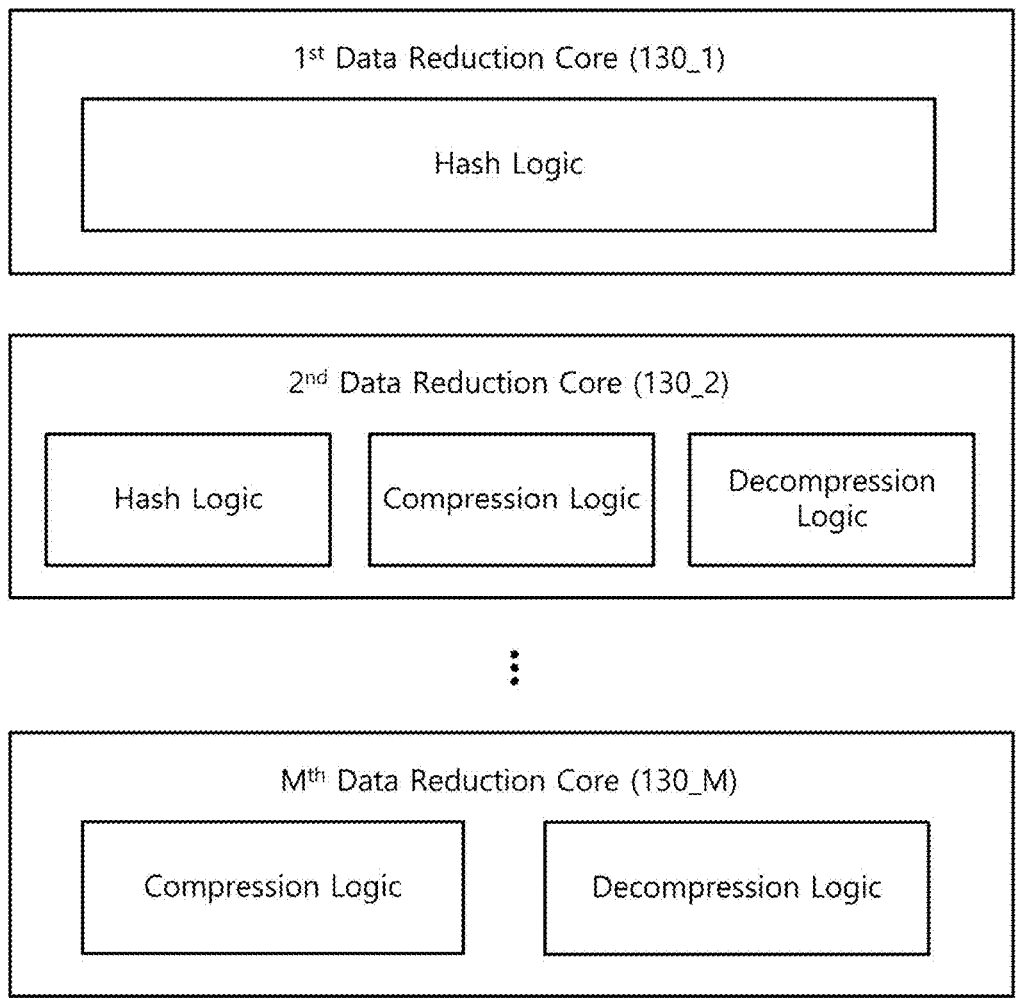
Figure 16:
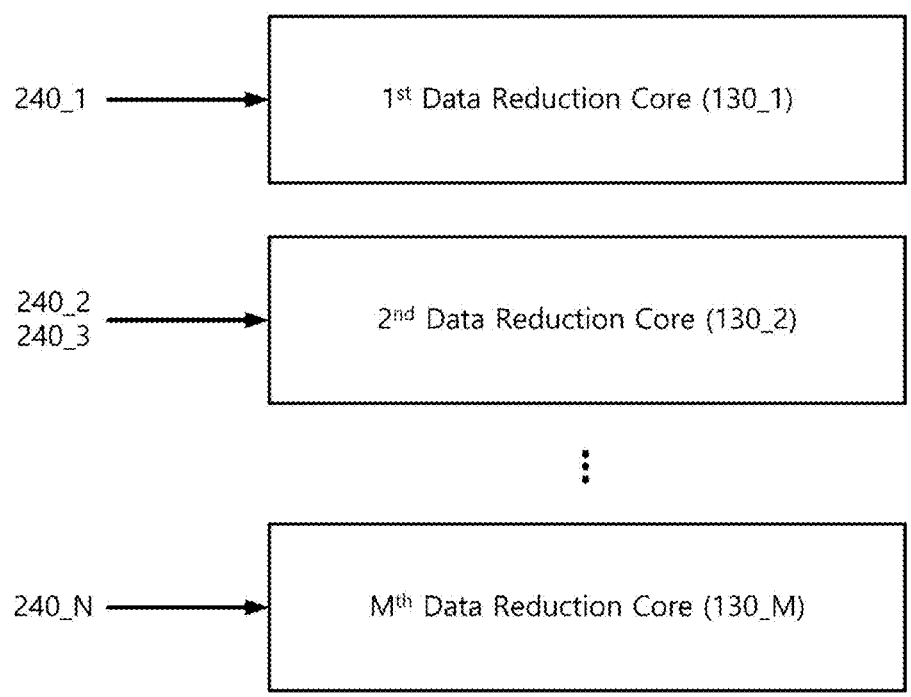

FIG. 13 is a diagram illustrating a data reduction device 100, including a plurality of data reduction cores 130, according to an exemplary embodiment, and FIGS. 14 to 16 are diagrams, each illustrating a plurality of data reduction cores 130 according to an exemplary embodiment.

Referring to FIGS. 13 and 14, the data reduction device 100 according to an exemplary embodiment may include a control module 110, a DMA engine 120, a data reduction core 130, a host interface unit 140, and a traffic scheduler 150, similarly to that of FIG. 10. The data reduction device 100 of FIG. 10 includes a single data reduction core 130, whereas the data reduction device 100 of FIG. 13 may include a plurality of data reduction cores 130.

The plurality of data reduction cores 130 may perform one of a first operation and a second operation. For example, each of a first data reduction core 130_1 and a second data reduction core 130_2 may include a hash logic to perform a hash operation, and an M-th data reduction core 130_M may include a compression logic to perform a compression operation. The M-th data reduction core 130_M may further include a decompression logic to perform a decompression operation in response to a read request of the CPU 210 of FIG. 2.

The traffic scheduler 150 may schedule one of the plurality of data reduction cores 130 to perform an operation corresponding to the kernel request KREQ, based on kernel requests KREQ1 and KREQ2 received by the data reduction device 100, to generate a schedule signal XSCH. For example, the traffic scheduler 150 may transmit the schedule signal XSCH to one of the first data reduction core 130_1 and the second data reduction core 130_2 when the first kernel request KREQ1 for a hash operation is received. Alternatively, the traffic scheduler 150 may transmit the schedule signal XSCH to the M-th data reduction core 130_M when the second kernel request KREQ2 for a compression operation is received.

However, exemplary embodiments are not limited thereto. The plurality of data reduction cores 130 may be implemented or scheduled in various manners.

For example, referring to FIG. 15, at least a portion of the plurality of data reduction cores 130 may perform both a hash operation and a compression operation. For example, the first data reduction core 130_1 may perform only a hash operation and the M-th data reduction core 130_M may perform only compression-related operations (a compression operation and a decompression operation), whereas the second data reduction core 130_2 may perform both the hash operation and the compression-related operations, similarly to that of FIG. 9.

Alternatively, referring to FIGS. 2, 13 and 16, at least a portion of the plurality of data reduction cores 130 may be provided for each storage device 240. For example, a first data reduction core 130_1 may perform a hash operation and compression-related operation corresponding to the first host request HREQ1 for a first storage device 240_1, and an M-th data reduction core 130_M may perform a hash operation and a compression-related operation corresponding to the first host request HREQ1 for an N-th storage device 240_N. In this case, at least a portion of the plurality of data reduction cores 130 may be shared to two or more storage devices 240. FIG. 16 illustrates an example in which a second data reduction core 130_2 performs a hash operation and a compression-related operation corresponding to a first host request HREQ1 for a second storage device 240_2 and the third storage device 240.

The traffic scheduler 150 may schedule an assignment or a change of the data reduction core 130 for each storage device 240 in consideration of a capacity or an access frequency of each storage device 240.

Figure 17:
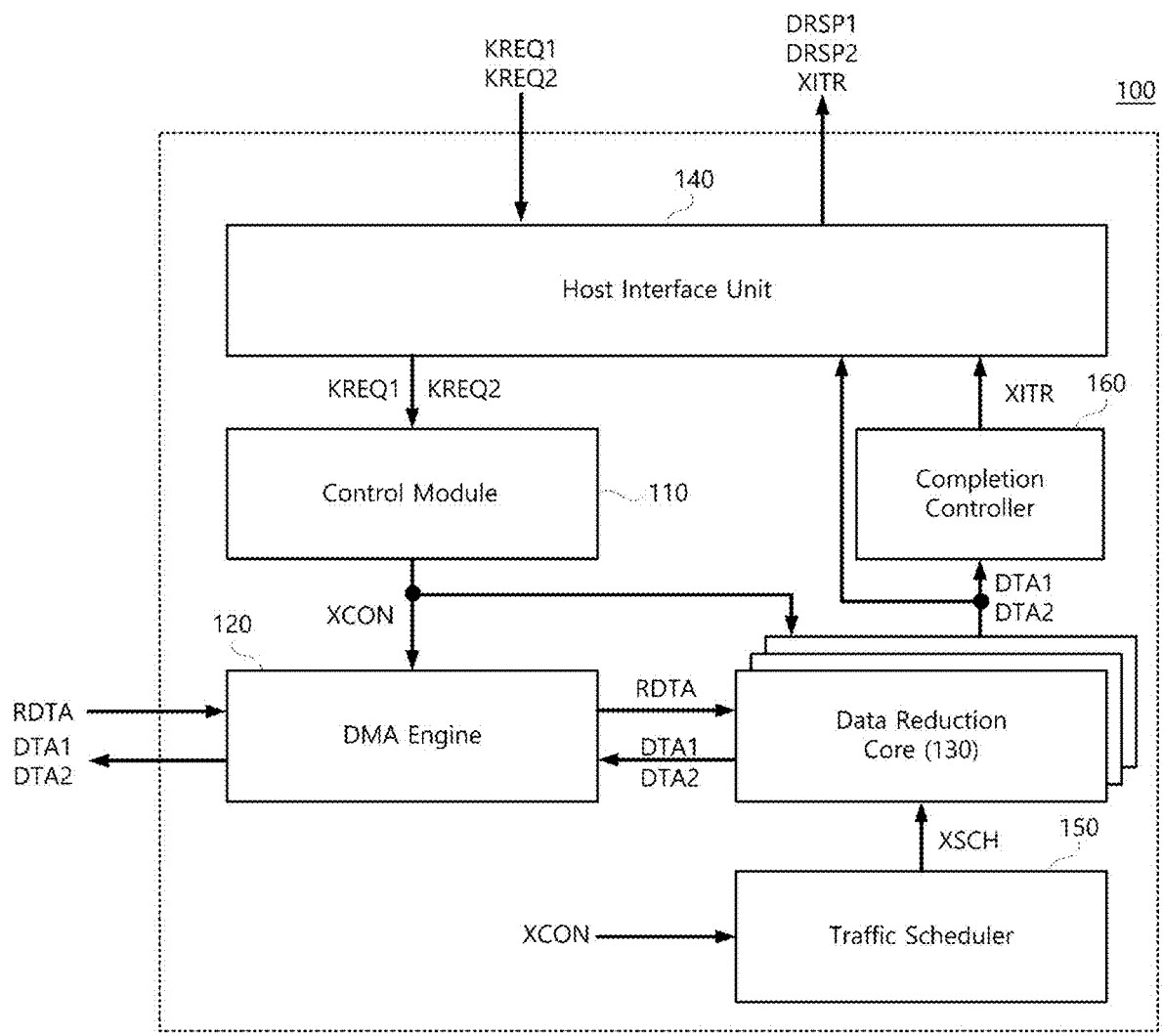
FIG. 17 is a diagram illustrating a data reduction device, including a completion controller, according to an exemplary embodiment of the present disclosure.

FIG. 17 is a diagram illustrating a data reduction device 100, including a completion controller 160, according to an exemplary embodiment.

Referring to FIGS. 2 and 17, the data reduction device 100 according to an exemplary embodiment may include a control module 110, a DMA engine 120, a data reduction core 130, and a host interface unit 140, and a traffic scheduler 150, similarly to that of FIG. 13. In an example, the data reduction core 130 may be provided in singular, and the traffic scheduler 150 may not be provided. The data reduction device 100 of FIG. 17 may further include a completion controller 160.

The completion controller 160 may generate an interrupt signal XITR when a first operation corresponding to any number of first kernel requests KREQ1 or a second operation corresponding to a second kernel request KREQ2 is completed in the data reduction core 130. For example, the completion controller 160 may generate an interrupt signal XITR when ten first kernel requests KREQ1 or second kernel requests KREQ2 are processed. The processing member of second kernel requests KREQ2 required for the completion controller 160 to generate the interrupt signal XITR may be to be vary depending on performance or resources required for the system 200 in which the data reduction device 100 is included.

The interrupt signal XITR may be transmitted to an external entity (for example, a kernel) through a host interface unit 140. The interrupt signal XITR may be transmitted to the CPU 210 of FIG. 2 as a response to the first host request HREQ1 through a kernel.

Figures 18, 19:
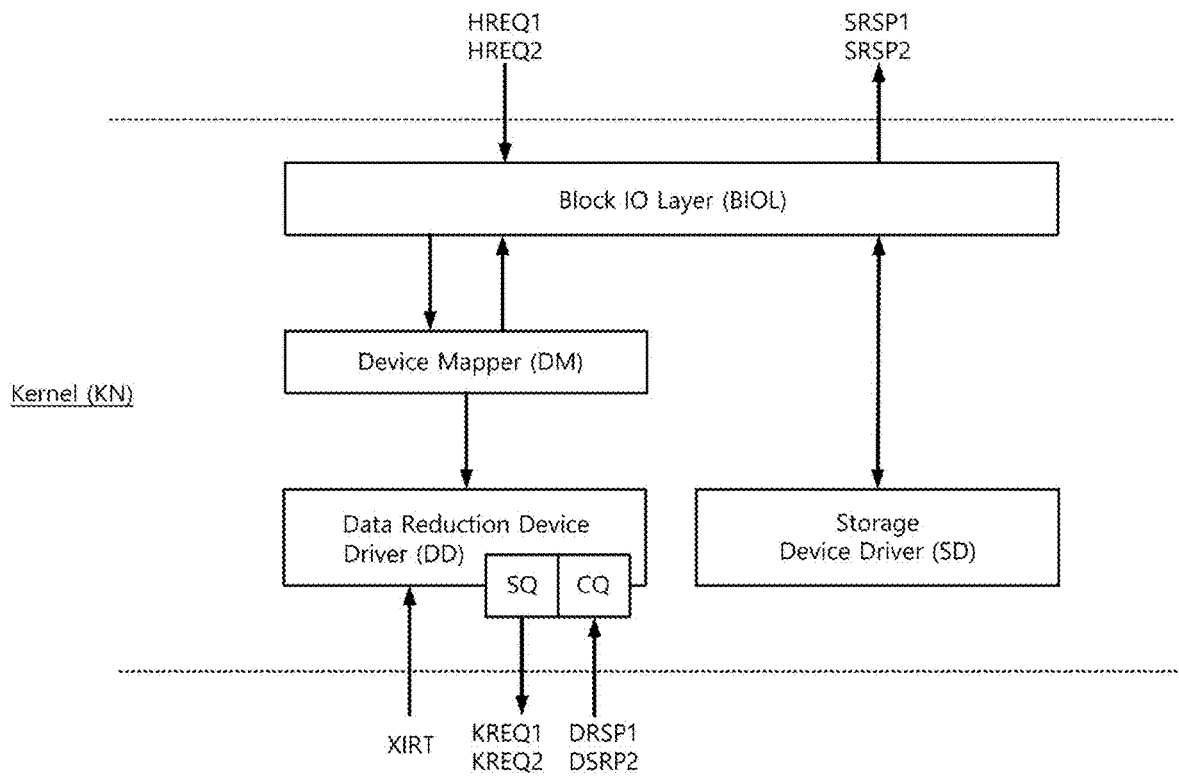
FIG. 18 is a diagram provided to describe a structure of a kernel for performing a data reduction operation according to an exemplary embodiment of the present disclosure.
FIG. 19 is a diagram illustrating a format of a first kernel request or a second kernel request according to an exemplary embodiment of the present disclosure.

FIG. 18 is a diagram provided to describe a structure of a kernel KN for performing a data reduction operation according to an exemplary embodiment.

Referring to FIGS. 2 and 18, a device mapper DM of the kernel KN and a data reduction device driver DD may be involved in order for the system 200 according to an exemplary embodiment to perform the above-described data reduction operation.

The device mapper DM may hook a first host request HREQ1 to generate a first kernel request KREQ1 or a second kernel request KREQ2. Also, the device mapper DM may process a first device response DRSP1 or a second device response DRSP2, received from the data reduction device 100, to correspond to the first kernel request KREQ1 or the second kernel request KREQ2. For example, by determining whether first reduction data DTA1 corresponding to the first device response DRSP1 is a unique value, the device mapper DM may determine whether the second kernel request KREQ2 is generated.

For example, when the first reduction data DTA1 is a hash value, the device mapper DM may include a mapping table, not illustrated, for determining whether the hash value is a unique value. By accessing the system memory 220 to read the first saved data DTA1 or receiving the first reduction data DTA1 from the data reduction device 100 to compare the received first reduction data DTA1 with other hash values in the mapping table, the device mapper DM may check whether the first reduction data DTA1 is a unique value. When the first reduction data DTA1 is read by accessing the system memory 220, address information included in the first device response DRSP1 will be referred to. When the first reduced data DTA1 is not a unique value, the device mapper DM may update an address of the first reduced data DTA1 in the mapping table to an address for a duplicate hash value.

When processing of a predetermined number of first kernel requests KREQ1 or second kernel requests KREQ2 in the data reduction device 100 is completed, for example, when a predetermined number of first device responses DRSP1 or second device responses DRSP2 are generated, the interrupt signal XITR may be received by the kernel KN. After an operation corresponding to the interrupt signal XITR is performed by the device mapper DD, a first storage response SRSP1 or a second storage response SRSP2, indicating completion of the operation, may be generated. One of the operations corresponding to the interrupt signal XITR may be an operation of packing compression results included in any number of second device responses DRSP2, for example, any number of pieces of second reduction data DTA2 into a single piece of block data BDTA.

A first storage response SRSP1 may be output as a response to the first host request HREQ1. A second storage response SRSP2 may be output as a response to the second host request HREQ2. As described above, the first host request HREQ1 may be a write request to the storage device 240 of the CPU 210, and the second host request HREQ2 may be a read request to the storage device 240 of the CPU 210.

The first host request HREQ1, the second host request HREQ2, the first storage response SRSP1, and the second storage response SRSP2 may be received from the CPU 210 or transmitted to the CPU 210 through a block IO layer BIOL of a kernel KR. The block IO layer BIOL may transmit a function call to the device mapper DM to the storage device 240 to a storage device driver SD of a kernel KR. For example, the device mapper DM may call a write function for writing block data BDTA, packed in units of blocks, in a corresponding storage device 240. The storage device driver SD may perform a write operation on the block data BDTA, packed in the storage device 240 in units of blocks, in response to the write function.

The data reduction device driver DD may replicate the first kernel request KREQ1 or the second kernel request KREQ2, received from the device mapper DM, to a submission queue SQ. Any number of first kernel requests KREQ1 or second kernel requests KREQ2 may be replicated to the submission queue SQ, and may be simultaneously transmitted to the data reduction device 100. Also, the data reduction device driver DD may receive the first device response DRSP1 or the second device response DRSP2 from the data reduction device 100 through a completion queue CQ. The first device response DRSP1 or the second device response DRSP2 may be transmitted to the device mapper DM to perform the above-described operation. Each of the submission queue SQ and the completion queue CQ may be provided in plural.

FIG. 19 is a diagram illustrating a format of a first kernel request KREQ1 or a second kernel request KREQ2 according to an exemplary embodiment.

Referring to FIGS. 18 and 19, the first kernel request KREQ1 or the second kernel request KREQ2 according to an exemplary embodiment may include an opcode field, a flags field, a size field, a source address field, and a destination address field.

The opcode field may indicate the type of an operation for data reduction required for the data reduction device 100. For example, the opcode code may indicate a hash operation, a compression operation, or the like. The flag field may indicate whether a corresponding request is a last command. For example, when there are 10 first kernel requests KREQ1 and second kernel requests KREQ2 which may be replicated to the submission queue SQ of the kernel KR, a flag may be set to a value of "0" for a first kernel request KREQ1 prior to a tenth first kernel request KREQ1 or a second kernel request KREQ2 prior to a tenth second kernel request KREQ2, and may be set to a value of "1" for the tenth first kernel request KREQ1 or the tenth second kernel request KREQ2, the last first or second kernel request. Size information of the request data RDTA may be included in the size field. An address of the request data RDTA may be included in the source address field, and a result value of a first operation (first reduction data DTA1) or a result value of a second operation (second reduction data DTA2) may be included in the destination address field.

The first kernel request KREQ1 or the second kernel request KREQ2 may further include a context field including atypical additional information, other than the above-described information.

FIG. 20 is a diagram illustrating an example of an offload hash function, called by a device mapper DM, according to an exemplary embodiment.

Referring to FIGS. 18 and 20, an offload hash function function offload_hash( ) according to an exemplary embodiment may be called by a device mapper DM. The offload hash function function offload_hash( ) may include a command cmnd, for example, a first kernel request KREQ1.

When the command cmnd is implemented in the format of FIG. 19, the command cmnd may be generated in such a manner that, for example, the type of the command is hash (cmnd.opcode=HASH), the command is a last command, among any predetermined number of commands (cmnd.flags=1), a size of request data RDTA is a block size (cmnd.size=BLOCK SIZE), a source address is "0x1234" (cmnd.src_addr=0x1234), and a destination address is "0xabcd" (cmnd.dst_addr=0xabcd). In this case, the block size may be 4 kilobytes (KB). FIG. 20 illustrates a case in which additional information is not present in the command cmnd (cmnd.context=NULL).

The offload_hash function function offload_hash( ) may include an operation submit_cmnd of transmitting the command cmnd to a data reduction device driver DD.

FIG. 21 is a diagram illustrating a format of a first device response DRSP1 or a second device response DRSP2 according to an exemplary embodiment.

Referring to FIG. 21, the first device response DRSP1 or the second device response DRSP2 according to an exemplary embodiment may include an opcode field, a status field, a size field, and a context field. The opcode field, the size field, and the context field may include the same information as those of FIG. 19 described above. For example, the opcode field may indicate the type of a corresponding operation, and the size field may indicate a size of a result of the operation. As described above, the type of the operation may be a hash operation or a compression operation, and the result of the operation may be first reduction data DTA1 or second reduction data DTA2.

The status field may indicate a processing status of a corresponding command. For example, the status field may indicate whether an error is present in a hash operation or a compression operation.

A description has been provided of an example in which the first operation and the second operation performed by the data reduction core 130 are respectively a hash operation and a compression operation, but exemplary embodiments are not limited thereto. The data reduction core 130 according to an exemplary embodiment may apply a data encryption operation to at least one of the first operation and the second operation. The data encryption operation, which may be applied to at least one of the first operation and the second operation by the data reduction core 130 according to an exemplary embodiment, may be implemented with an algorithm such as advanced encryption standard (AES), blowfish, data encryption standard (EDS), Rivest-Shamir-Adleman (RSA), digital signature standard (DSA), or crc32.

In addition, a description has been described of an example in which the first operation and the second operation performed by the data reduction core 130 are sequentially performed, but exemplary embodiments are not limited thereto. The data reduction core 130 according to an exemplary embodiment may simultaneously perform the first operation and the second operation on a single piece of request data RDTA, may neglect a result of the second operation depending on whether corresponding request data is a unique value.

As described above, according to the data reduction device 100, the data reduction method 300, and the system 200 according to exemplary embodiments, data processing efficiency for limited resources may be improved through a data reduction operation. In addition, according to the data reduction device 100, the data reduction method 300, and the system 200 including the data reduction device 100 according to exemplary embodiments, a CPU-intensive data reduction operation may be offloaded to reduce use of a CPU. Accordingly, a data processing speed in the system may be increased, and a power consumption issue and an environmental issue may be addressed.

As described above, according to a data reduction device, a data reduction method, and a system including the data reduction device according to an exemplary embodiment, data processing efficiency for limited resources may be increased through a data reduction operation.

In addition, according to a data reduction device, a data reduction method, and a system including the data reduction device according to an exemplary embodiment, a CPU-intensive data reduction operation may be offloaded to reduce use of a CPU. Accordingly, a data processing speed in the system may be increased.

Although exemplary embodiments of the present disclosure have been described in detail, it will be understood by those skilled in the art that various changes and modifications may be made without departing from the spirit or scope of the present disclosure. Therefore, the scope of the present disclosure is not construed as being limited to the described embodiments but is defined by the appended claims as well as equivalents thereto.

What is claimed is:

1. A data reduction device comprising:
a circuitry configured to:
generate a control signal in response to a first kernel request received from an external entity;
read requested data corresponding to the first kernel request from an external entity in response to the control signal; and
reduce the requested data as a first reduction data by performing a first operation that is an offloaded operation corresponding to the first kernel request, and reduce the first reduction data as a second reduction data by performing a second operation when the first reduction data is a unique value.

2. The data reduction device of claim 1, wherein the first operation is a hash operation.

3. The data reduction device of claim 1, wherein the second operation is a compression operation.

4. The data reduction device of claim 1, wherein the circuitry is further configured to control the second operation in response to a second kernel request received from the external entity.

5. The data reduction device of claim 1, wherein the circuitry is further:
configured to schedule performance of the first operation and the second operation.

6. The data reduction device of claim 1, wherein the circuitry performs the first operation and the second operation in parallel.

7. The data reduction device of claim 6, wherein the circuitry performs the first or second operation separately for a respective external storage device.

8. The data reduction device of claim 1, the circuitry is further configured to generate an interrupt signal when a predetermined number of the first kernel request or a second kernel request received from the external entity is processed.

9. The data reduction device of claim 1, which is implemented as a chip or a card.

10. A system comprising:
a central processing unit (CPU) configured to generate a first host request;
a system memory into which requested data corresponding to the first host request is loaded; and
a data reduction device configured to reduce the requested data as a first reduction data by performing a first operation, and to reduce the first reduction data as a second reduction data by performing a second operation when the first reduction data is a unique value, in response to kernel requests corresponding to the first host request.

11. The system of claim 10, wherein the first operation is a hash operation, and the second operation is a compression operation.

12. The system of claim 10, wherein the data reduction device comprises a circuitry
configured to;
receive a first kernel request among the kernel requests to generate a control signal;
read the requested data from the system memory in response to the control signal; and
execute at least one arithmetic logic corresponding to the first operation or the second operation.

13. The system of claim 12, wherein the circuitry is further:
configured to schedule performance of the first operation and the second operation.

14. The system of claim 12, wherein the circuitry is further:
configured to generate an interrupt signal when a predetermined number of the first kernel request or a second kernel request among the kernel requests are processed.

15. The system of claim 10, wherein the first host request is hooked to generate first and second kernel requests among the kernel requests, and the data reduction device performs the first operation in response to the first kernel request and performs the second operation in response to the second kernel request.

16. The system of claim 10, wherein the first kernel requests comprise a type of the first or second operation, a size of data, a source address for the requested data and a destination address for the first or second reduction data.

17. A data reduction method comprising:
offloading a hash operation on requested data corresponding to a first host request, by a data reduction device;
outputting a result of the hash operation as a first device response corresponding to the first host request when the result of the hash operation is not a unique value, by the data reduction device;
and offloading a compression operation on the result of the hash operation when the result of the hash operation is a unique value, by the data reduction device.

18. The data reduction method of claim 17, further comprising:

offloading a decompression operation on requested data corresponding to a second host request by the data reduction device.

\* \* \* \* \*